(12) United States Patent
Naffziger et al.

(10) Patent No.: US 8,710,868 B2
(45) Date of Patent: Apr. 29, 2014

(54) SENSE-AMPLIFIER MONOTIZER

(75) Inventors: Samuel D. Naffziger, Fort Collins, CO (US); Visvesh S. Sathe, Fort Collins, CO (US); Srikanth Arekapudi, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 283 days.

(21) Appl. No.: 12/974,203

(22) Filed: Dec. 21, 2010

(65) Prior Publication Data
US 2012/0154188 A1 Jun. 21, 2012

(51) Int. Cl.
*G11C 7/00* (2006.01)

(52) U.S. Cl.
USPC .............................. 327/57; 327/530

(58) Field of Classification Search
USPC ............... 327/57, 530–550, 560–563
See application file for complete search history.

(56) References Cited

U.S. PATENT DOCUMENTS 7,124,221 B1 * 10/2006 Zerbe et al. .................... 710/106
7,813,199 B2 * 10/2010 Morgan ......................... 365/205

OTHER PUBLICATIONS

Stojanovic, Vladimir, "Lecture 10: Latch and Flip-Flop Design" Computer Systems Laboratory, Stanford University, May 7, 2001 (p. 22).

* cited by examiner

*Primary Examiner* — Lincoln Donovan
*Assistant Examiner* — Diana J Cheng
(74) *Attorney, Agent, or Firm* — Volpe and Koenig, P.C.

(57) ABSTRACT

A sense-amplifier monotizer includes an amplifier circuit and a keeper circuit. The amplifier circuit outputs a predetermined logic state while a clock signal is in a first phase, and samples a data signal and outputs at least one of the data signal and a complementary logic state of the data signal while the clock signal is in a second phase. A subsequent change of the data signal does not affect an output of the amplifier circuit once the data signal is sampled while the clock signal is in the second phase. The keeper circuit keeps a logic state of the sampled data signal once the data signal is sampled while the clock signal is in the second phase. The amplifier circuit may receive multiple data signals, and output a data signal selected by the select signal and/or a complementary value while the clock signal is in the second phase.

8 Claims, 4 Drawing Sheets

SENSE-AMPLIFIER MONOTIZER

BACKGROUND

Sequential elements known as monotizers are used in high performance digital designs to enable the correct transition of computation, for example, from a conventional complementary metal-oxide-semiconductor (CMOS) logic stage to a dynamic logic state. The monotizer ensures that the logic state at the input of the monotizer is latched in a race-free manner, and the output of the monotizer, which typically feeds into an input of a dynamic logic, is held in a particular state (depending on the nature of the dynamic logic) so as to ensure robust, glitch-free operation during the evaluation phase of the logic.

FIG. 1 shows a conventional monotizer. While the clock 102 is high, the latch 104 samples the data input, and the outputs, (q_AR and q_ARX), are both held low. As the clock 102 transitions to low, data is latched, and the data and its complementary value are output on q_AR and q_ARX, respectively. As the clock 102 subsequently transitions to high, the latch is free to sample data, and q_AR and q_ARX revert to the logic state 0. Such an implementation incurs a significant delay and degrades the performance.

FIG. 2 shows a conventional monotizer used with a multiplexer. A multiplexer 204 outputs one of the inputs, S1X and S0X, depending on the multiplexer select signal C, and the output of the multiplexer 204 is provided to a latch 206, which latches its input on the falling edge of the clock signal 202. While the clock 202 is high, the outputs Q and $\overline{Q}$ are both held low. As the clock 202 transitions to low, the output of the multiplexer 204 is latched, and the multiplexer output and its complementary value are output on Q and $\overline{Q}$, respectively. As the clock 202 subsequently transitions to high, the latch 206 is free to sample the output of the multiplexer 204, and Q and $\overline{Q}$ revert to the logic state 0. This implementation incurs a significant delay and degrades the performance.

SUMMARY OF EMBODIMENTS OF THE INVENTION

A sense-amplifier monotizer includes an amplifier circuit and a keeper circuit. The amplifier circuit outputs a predetermined logic state while a clock signal is in a first phase, and samples a data signal and outputs at least one of the data signal and a complementary logic state of the data signal while the clock signal is in a second phase. A subsequent change of the data signal does not affect an output of the amplifier circuit once the data signal is sampled while the clock signal is in the second phase. The keeper circuit keeps a logic state of the sampled data signal once the data signal is sampled while the clock signal is in the second phase.

The amplifier circuit may receive multiple data signals, and output a data signal selected by the select signal and/or a complementary value of the selected data signal while the clock signal is in the second phase.

BRIEF DESCRIPTION OF THE DRAWINGS

A more detailed understanding may be had from the following description, given by way of example in conjunction with the accompanying drawings wherein.

DETAILED DESCRIPTION

Figure 1:
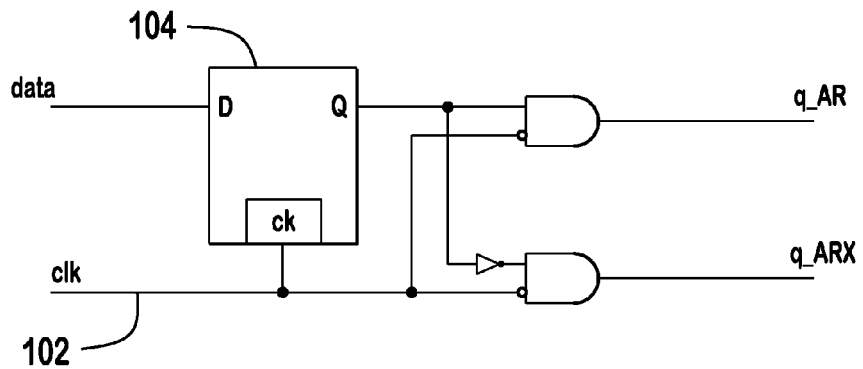
FIG. 1 shows a conventional monotizer.

Embodiments for a sense-amplifier monotizer are explained with reference to the drawings. It should be noted that the drawings are provided as an example, not as a limitation, and variations other than the structures shown in the drawings are possible.

Figure 3:
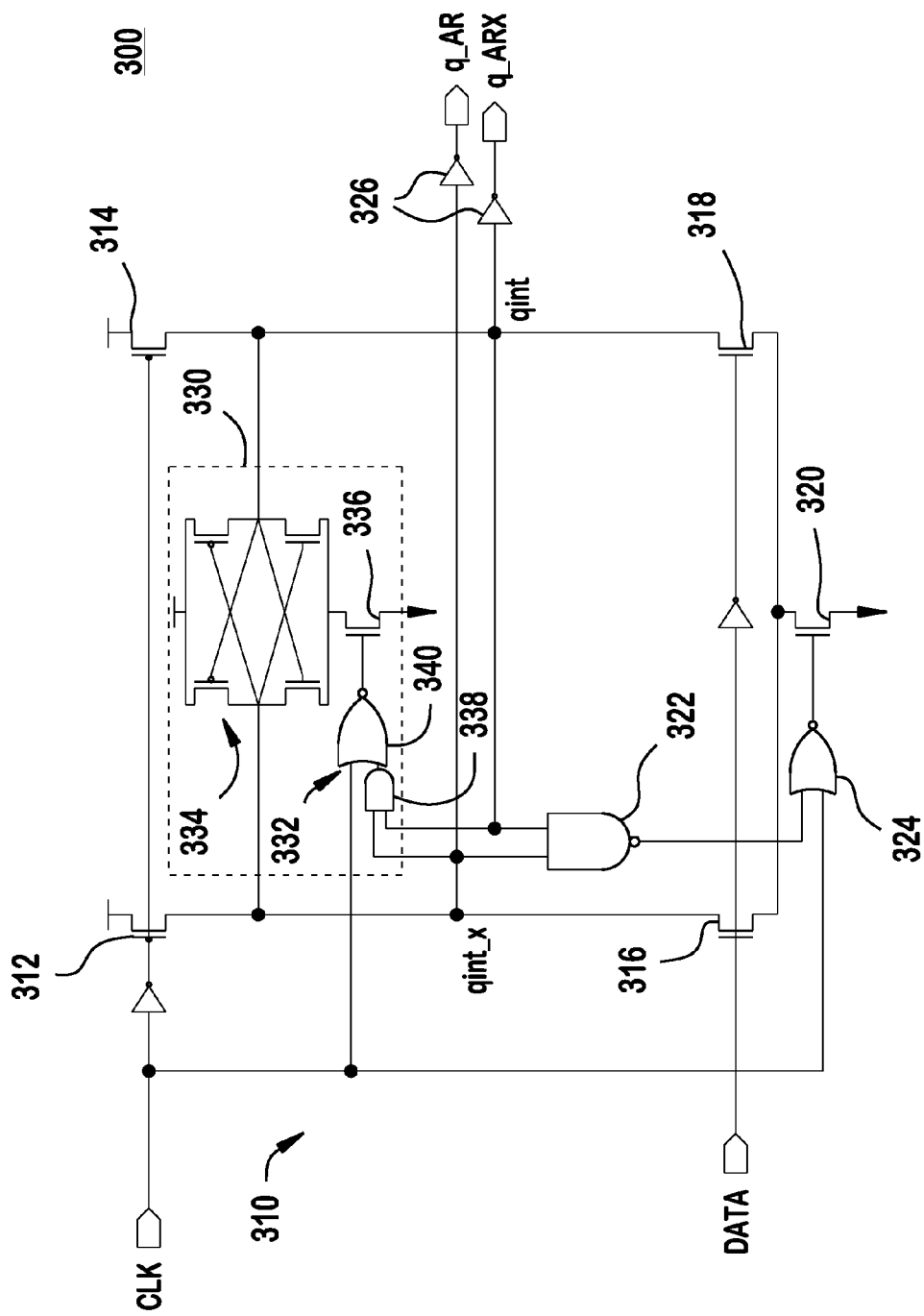
FIG. 3 shows an example sense-amplifier monotizer in accordance with one embodiment.

FIG. 3 shows an example sense-amplifier monotizer 300 in accordance with one embodiment. The sense-amplifier monotizer 300 implements the logical operation of the monotizer circuit in FIG. 1 with a significantly lower delay, enabling higher system performance.

The sense-amplifier monotizer 300 comprises an amplifier circuit 310 and a keeper circuit 330. The amplifier circuit 310 may include two amplifier legs (described below), a NAND gate 322, a NOR gate 324, and inverters 326. The first amplifier leg comprises a first p-type metal-oxide-semiconductor (PMOS) transistor 312, a first n-type metal-oxide-semiconductor (NMOS) transistor 316, and a third NMOS transistor 320. The second amplifier leg comprises a second PMOS transistor 314, a second NMOS transistor 318, and the third NMOS transistor 320. The third NMOS transistor 320 is shared by the first and second amplifier legs.

The NAND gate 322 is driven by the outputs of the first and second amplifier legs (identified in FIG. 3 as the signals qint and qint_x). The NOR gate 324 is driven by a clock signal (CLK) and the output of the NAND gate 322. The first and second PMOS transistors 312, 314 are connected to a supply voltage and driven by an inverted clock signal. The third NMOS transistor 320 is connected to ground and driven by an output of the NOR gate 324. The first NMOS transistor 316 is connected between the first PMOS transistor 312 and the third NMOS transistor 320 and driven by the data signal. The second NMOS transistor 318 is connected between the second PMOS transistor 314 and the third NMOS transistor 320 and driven by an inverted data signal.

Figure 4:
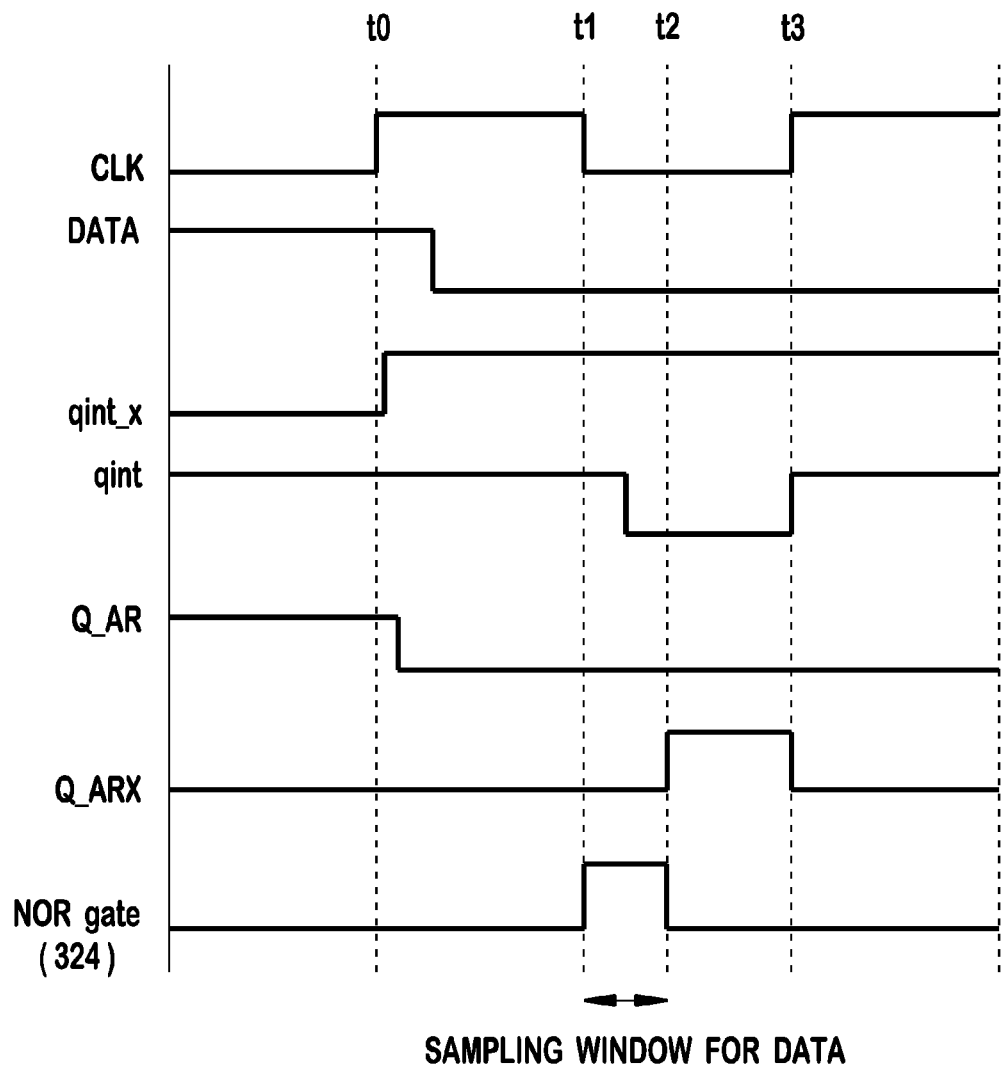
FIG. 4 is a timing diagram showing the operation of the sense-amplifier monotizer in FIG. 3.

The operation of the sense-amplifier monotizer 300 will be explained with reference to the timing diagram in FIG. 4. When the clock signal goes high at $t_o$, the PMOS transistors 312, 314 are turned on, and the third NMOS transistor 320 is turned off, which pulls both qint_x and qint up. The qint_x and qint are provided to the outputs through the inverters 326 so that the sense-amplifier monotizer outputs q_AR and q_ARX go low. The qint_x and qint are also fed to the NAND gate 322, which generates a logic state 0 signal while the clock signal is high. When the clock signal goes low at $t_1$, the PMOS transistors 312, 314 are turned off, and the NMOS transistor 320 is turned on so that the data signal is sampled by each of the first and second amplifier legs. As the data signal is sampled, one of qint_x and qint will go low and the other will remain high since the inverted data signal drives the second amplifier leg. This transition of the qint_x and qint drives the NAND gate 322 to generate a logic state 1 signal, which will in turn drive the NOR gate 324 to generate a logic state 0 signal, which will, in turn, turn the third NOMS transistor 320 off at $t_2$. The data signal is sampled during the short sampling window (between t1 and t2), and the sense-amplifier 300 is latched so that the data signal no longer drives the sense-amplifier 300.

The transition of qint_x and qint to '1' and '0' (or vice versa depending on the data) will turn the keeper circuit 330 on while the clock signal is low. The example keeper circuit 330 may include an AND-OR-NOT gate 332, a cross-coupled two sets of stacked PMOS and NMOS transistors 334, and an NMOS transistor 336. The AND gate 338 is driven by the qint_x and qint signals, and the OR gate 340 is driven by the output of the AND gate and the clock signal, so that the NMOS transistor 336 (and the keeper circuit) is turned on when the clock signal is low and both the qint_x and qint signals are not high, (i.e., when the data is sampled). The keeper circuit 330 maintains the logic state of the qint_x and qint while the clock signal is low.

When the clock signal goes up at t3, the PMOS transistors 312, 314 are turned on, the keeper circuit 330 is turned off, the NMOS transistor 320 remains turned off, and the sense-amplifier monotizer outputs q_AR and q_ARX go low.

Higher speed operation is possible through the use of the sense-amplifier 300, which retains the logic state of the output with the keeper circuit 330 as soon as the sense amplifier has evaluated. The circuit shown in FIG. 3 results in significantly lower computational delay than the conventional monotizers.

The sense-amplifier monotizer may work as a multiplexer such that the amplifier circuit receives a plurality of data signals and outputs a data signal selected by a select signal and/or a complementary of the selected data signal while the clock signal is in the second phase.

Figure 2:
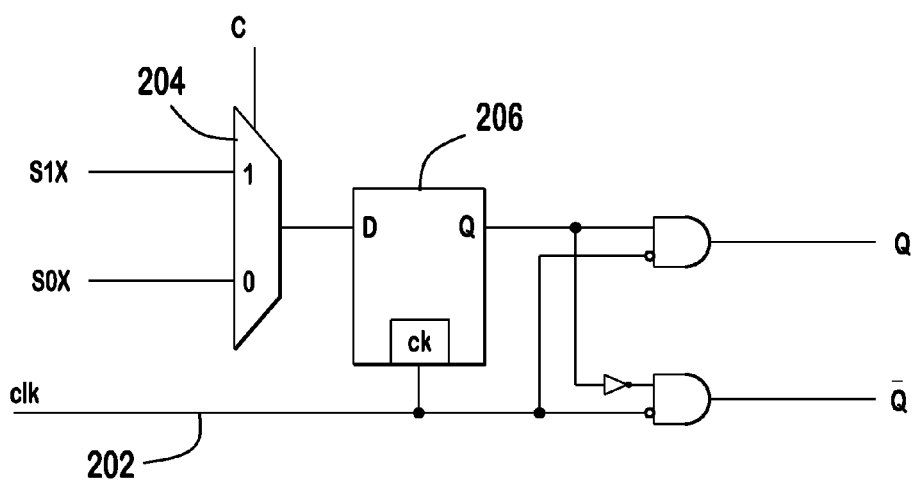
FIG. 2 shows a conventional monotizer used with a multiplexer.
Figure 5:
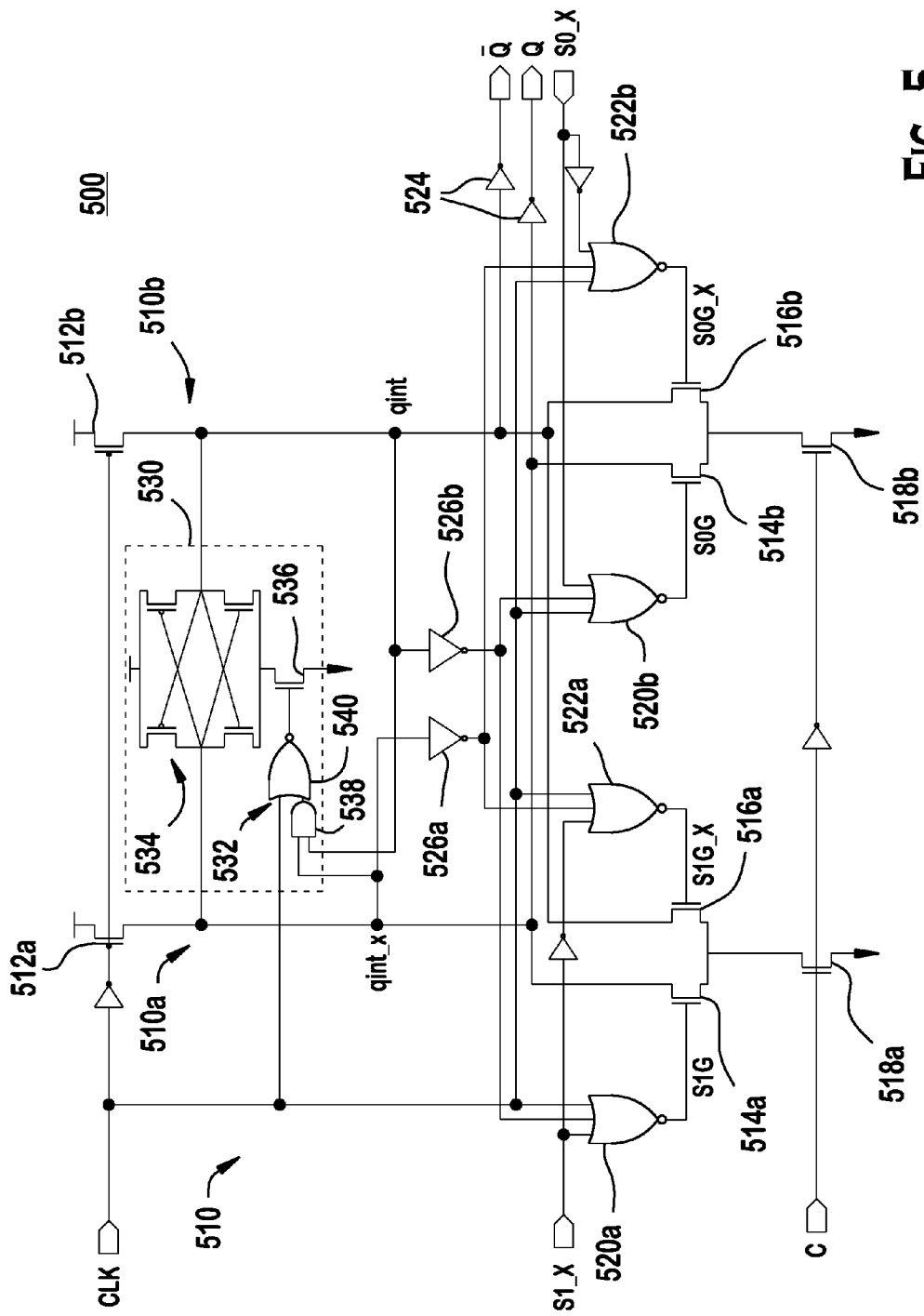
FIG. 5 shows an example sense-amplifier multiplexer monotizer in accordance with one embodiment.

FIG. 5 shows an example sense-amplifier multiplexer monotizer 500 in accordance with one embodiment. The sense-amplifier multiplexer monotizer 500 implements the logical operation of the monotizer circuit in FIG. 2 while selectively outputting one of the input data signals based on the select signal. It should be noted that FIG. 5 is provided as an example, not as a limitation, and variations are possible.

The sense-amplifier multiplexer monotizer 500 may include an amplifier circuit 510 and a keeper circuit 530. The amplifier circuit 510 includes two amplifier legs 510a, 510b. Two amplifier legs 510a, 510b are shown in FIG. 5 as an example for multiplexing two input data signals (S1_X and S0_X), but any number of amplifier legs may be used.

The amplifier leg 510a comprises a PMOS transistor 512a, an NMOS transistor 514a, an NMOS transistor 516a, an NMOS transistor 518a, a NOR gate 520a, and a NOR gate 522a. The PMOS transistor 512a is connected to a supply voltage and driven by an inverted clock signal. The NMOS transistor 518a is connected to ground and driven by the select signal C. The NMOS transistor 514a and the NMOS transistor 516a are coupled in parallel, and are connected between the PMOS transistor 512a and the NMOS transistor 518a. The NOR gate 520a is driven by the clock signal, an amplifier leg output (qint_x) of the amplifier leg 510b, and the first data signal (S1_X), and the NOR gate 522a is driven by the clock signal, an inverted amplifier leg output (qint) of the amplifier leg 510a, and an inverted first data signal. The NMOS transistor 514a is driven by an output of the NOR gate 520a, and the NMOS transistor 516a is driven by an output of the NOR gate 522a.

The amplifier leg 510b comprises a PMOS transistor 512b, an NMOS transistor 514b, an NMOS transistor 516b, an NMOS transistor 518b, a NOR gate 520b, and a NOR gate 522b. The PMOS transistor 512b is connected to a supply voltage and driven by an inverted clock signal. The NMOS transistor 518b is connected to ground and driven by the select signal C. The NMOS transistor 514b and the NMOS transistor 516b are coupled in parallel, and are connected between the PMOS transistor 512b and the NMOS transistor 518b. The NOR gate 520b is driven by the clock signal, an amplifier leg output (qint_x) of the amplifier leg 510b, and the second data signal (S0_X), and the NOR gate 522b is driven by the clock signal, an inverted amplifier leg output (qint) of the amplifier leg 510a, and an inverted second data signal. The NMOS transistor 514b is driven by an output of the NOR gate 520b, and the NMOS transistor 516b is driven by an output of the NOR gate 522b.

When the clock signal goes high, the PMOS transistors 512a, 512b are turned on, and the NMOS transistor 514a, 514b and the NMOS transistor 516a, 516b remain turned off since the NOR gates 520a, 520b, 522a, 522b will supply a logic state 0 signal to the NMOS transistors 514a, 514b, 516a, 516b, which pulls both qint_x and qint up. The qint_x and qint are fed to the outputs through inverters 224 so that the sense-amplifier monotizer outputs Q and $\overline{Q}$ go low. The qint is fed to the NOR gates 520a, 522a through the inverter 226b, and the qint_x is fed to the NOR gates 520b, 522b through the inverter 226a.

The multiplexer select signal C and the inverted select signal will drive the NMOS transistors 518a and 518b, respectively, so that one of the amplifier legs 510a, 510b will be turned on by the multiplexer select signal. Assuming that the multiplexer select signal selects the first input data S1_X, when the clock signal goes low, the PMOS transistors 512a, 512b are turned off, and the input data signal (S1_X in this example) and its complementary logic state will be sampled to qint_x and qint, respectively.

As the data signal is sampled, one of qint_x and qint will go low and the other will remain high depending on the selected input data signal since the inverted data signal drives the amplifier leg 510b. Both of them were '1' due to being pre-charged prior to the clock signal (CLK) going low. The transition of qint_x or qint to '0' will turn the keeper circuit 530 on while the clock signal is low. The keeper circuit 530 includes an AND-OR-NOT gate 532, a cross-coupled two sets of stacked PMOS and NMOS transistors 534, and an NMOS transistor 536. The AND gate 538 is driven by the qint_x and qint signals, and the OR gate 540 is driven by the output of the AND gate and the clock signal, so that the NMOS transistor 536 (and the keeper circuit) is turned on when the clock signal is low and both the qint_x and qint signals are not high, (i.e., when the data is sampled). The keeper circuit 530 maintains the logic state of the qint_x and qint while the clock signal is low.

In the sense-amplifier monotizer in FIG. 3, the transition of qint_x or qint signals to '0' latches the amplifier circuit by turning the NMOS transistor 320 off, and once it is latched the input data no longer drives the amplifier circuit. In contrast, in the amplifier circuit 510 in FIG. 5, the amplifier circuit 510 is not completely latched as the input data is sampled, but the subsequent change of the input data after the data is sampled does not drive the amplifier circuit 510 to transition the qint_x and qint signals, and the qint_x and qint signals are maintained by the keeper circuit 530 while the clock signal is low. For example, when the data S1_X is '1', qint_x will stay at '1' and qint will transition to '0' when the clock signal goes down. The inverted qint signal does not affect the output of the NOR gate 520a. If the data subsequently changes to '0' after the data is sampled while the clock signal is low, the inverted qint signal will prevent the NMOS transistor 514a from turning on by this subsequent data change. The subsequent data change to '0' will turn off the NMOS transistor 516a, but the qint signal will be maintained by the keeper circuit 530. If qint gets discharged to '0', qint_x is disconnected from the input by having the outputs of the NOR gates 520a and 520b forced low when the output of the inverter 526b goes high due to qint going low.

When the clock signal goes up again, the PMOS transistors 512a, 512b are turned on, the keeper circuit 530 is turned off, and the NMOS transistors 514a, 514b, 516a, 516b will be turned off, and the sense-amplifier monotizer outputs Q and $\overline{Q}$ go low.

With this embodiment, a higher speed operation is possible through the use of a sense-amplifier structure, which retains the logic state of the output with a keeper structure as soon as the sense amplifier has evaluated. The sense-amplifier circuit exploits the different arrival times among the inputs to the multiplexer (input data S1X, S0X may arrive before the select signal C) by performing the required gating operation with the clock signal and the dual-rail evaluation rails qint_x and qint with the early arriving signals. The amplifier circuit results in significantly lower computational delay than the conventional monotizers.

Currently, the vast majority of electronic circuits are designed and manufactured by using software, (e.g., hardware description language (HDL)). HDL is a computer language for describing structure, operation, and/or behavior of electronic circuits. The sense-amplifier monotizer 300, 500 may be designed and manufactured by using software (e.g., HDL). HDL may be any one of the conventional HDLs that are currently being used or will be developed in the future. A set of instructions are generated with the HDL to describe the structure, operation, and/or behavior of the sense-amplifier monotizer 300, 500. The set of instructions may be stored in any kind of computer-readable storage medium.

Although features and elements are described above in particular combinations, one of ordinary skill in the art will appreciate that each feature or element can be used alone or in any combination with the other features and elements. In addition, the embodiments described herein may be implemented in any type of processors or chipsets including, but not limited to, a central processing unit (CPU), a graphics processing unit (GPU), a digital signal processor (DSP), a microprocessor, Application Specific Integrated Circuits (ASICs), and any other type of integrated circuit (IC).

Currently, the vast majority of electronic circuits are designed and manufactured by using software, (e.g., hardware description language (HDL)). HDL is a computer language for describing structure, operation, and/or behavior of electronic circuits. The sense-amplifier monotizer 300, 500 (i.e., the electronic circuit) may be designed and manufactured by using software (e.g., HDL). HDL may be any one of the conventional hardware design languages that are currently being used or will be developed in the future. A set of instructions are generated with the HDL to describe the structure, operation, and/or behavior of the sense-amplifier monotizer 300, 500. The set of instructions may be stored in any kind of computer-readable storage medium.

Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A sense-amplifier monotizer comprising:
    an amplifier circuit configured to output a select logic state while a clock signal is in a first phase, and sample a data signal and output at least one of the data signal and a complementary logic state of the data signal while the clock signal is in a second phase, wherein the amplifier circuit is configured to be latched responsive to a state transition of an output of the amplifier circuit as the data signal is sampled by the amplifier circuit while the clock signal is in the second phase; and
    a keeper circuit configured to keep a logic state of the sampled data signal once the data signal is sampled while the clock signal is in the second phase;
    wherein the amplifier circuit comprises two amplifier legs for sampling the data signal and a complementary logic state of the data signal, respectively, and the amplifier circuit is configured to be latched as the data signal and the complementary logic state of the data signal are sampled while the clock signal is in the second phase and wherein the data signal and the complementary logic state of the data signal drive a NAND gate, which drives, along with the clock signal, a NOR gate, which drives a transistor of the amplifier legs, such that the amplifier circuit is latched as the data signal and the complementary logic state of the data signal are sampled while the clock signal is in the second phase.

2. The sense-amplifier monotizer of claim 1 wherein the amplifier circuit comprises:
    a first transistor connected to a supply voltage and having an input gate to receive an inverted clock signal;
    a first logic gate configured to generate an intermediate signal responsive to the outputs of the amplifier circuit;
    a second logic gate configured to receive the clock signal and the intermediate signal;
    a second transistor connected to ground and having an input gate to receive an output of the second logic gate; and
    a third transistor connected between the first transistor and the second transistor and having an input gate to receive the data signal.

3. The sense-amplifier monotizer of claim 1 wherein the amplifier circuit comprises:
    a NAND gate for generating an intermediate signal depending on the outputs of the amplifier circuit;
    a NOR gate configured to receive the clock signal and the intermediate signal;
    a first amplifier leg comprising a first p-type metal-oxide-semiconductor (PMOS) transistor, a first n-type metal-oxide-semiconductor (NMOS) transistor, and a third NMOS transistor, the first PMOS transistor being connected to a supply voltage and having an input gate to receive an inverted clock signal, the first NMOS transistor being connected between the first PMOS transistor and the third NMOS transistor and having an input gate to receive the data signal, and the third NMOS transistor being connected to ground and having an input gate to receive an output of the NOR gate; and
    a second amplifier leg comprising a second PMOS transistor, a second NMOS transistor, and the third NMOS transistor, the second PMOS transistor being connected to a supply voltage and having an input gate to receive the inverted clock signal, the second NMOS transistor being connected between the second PMOS transistor and the third NMOS transistor and having an input gate to receive an inverted data signal.

4. An integrated circuit (IC) device comprising the sense-amplifier monotizer of claim 1.

5. A processor comprising the sense-amplifier monotizer of claim 1.

6. A method of latching an input signal, the method comprising:
    outputting a select logic state while a clock signal is in a first phase; and
    sampling with an amplifier circuit a data signal and outputting at least one of the data signal and a complementary logic state of the data signal while the clock signal is in a second phase, wherein the amplifier circuit is latched responsive to a state transitioning of an output of the amplifier circuit as the data signal is sampled by the amplifier circuit while the clock signal is in the second phase and a logic state of the sampled data signal is kept by a keeper circuit once the data signal is sampled while the clock signal is in the second phase;

wherein the amplifier circuit comprises two amplifier legs for sampling the data signal and a complementary logic state of the data signal, respectively, and the amplifier circuit is latched as the data signal and the complementary logic state of the data signal are sampled while the clock signal is in the second phase and wherein the data signal and the complementary logic state of the data signal drive a NAND gate which drives along with the clock signal a NOR gate, which drives a transistor of the amplifier legs, such that the amplifier circuit is latched as the data signal and the complementary logic state of the data signal are sampled while the clock signal is in the second phase.

7. A computer-readable storage medium storing a code for describing a structure and/or a behavior of an amplifier circuit for outputting a select logic state while a clock signal is in a first phase, and sampling a data signal and outputting at least one of the data signal and a complementary logic state of the data signal while the clock signal is in a second phase, wherein the amplifier circuit is latched responsive to a state transitioning of an output of the amplifier circuit as the data signal is sampled by the amplifier circuit while the clock signal is in the second phase and a logic state of the sampled data signal is kept by a keeper circuit once the data signal is sampled while the clock signal is in the second phase;

wherein the amplifier circuit comprises two amplifier legs for sampling the data signal and a complementary logic state of the data signal, respectively, and the amplifier circuit is latched as the data signal and the complementary logic state of the data signal are sampled while the clock signal is in the second phase and wherein the data signal and the complementary logic state of the data signal drive a NAND gate which drives along with the clock signal a NOR gate, which drives a transistor of the amplifier legs, such that the amplifier circuit is latched as the data signal and the complementary logic state of the data signal are sampled while the clock signal is in the second phase.

8. The computer-readable storage medium of claim 7 wherein the code is written in a hardware description language (HDL).

* * * * *